United States Patent
Tsironis

(10) Patent No.: US 11,156,656 B1
(45) Date of Patent: Oct. 26, 2021

(54) WAVEGUIDE SLIDE SCREW TUNER WITH ROTATING DISC PROBES

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 105 days.

(21) Appl. No.: 16/262,112

(22) Filed: Jan. 30, 2019

(51) Int. Cl.
| | |
|---|---|
| *H03H 7/12* | (2006.01) |
| *H03H 7/38* | (2006.01) |
| *H03H 7/40* | (2006.01) |
| *G01R 35/00* | (2006.01) |
| *G01R 31/26* | (2020.01) |
| *G01R 31/28* | (2006.01) |
| *G01R 31/319* | (2006.01) |
| *G01R 27/32* | (2006.01) |
| *H01P 3/02* | (2006.01) |

(52) U.S. Cl.
CPC ..... *G01R 31/2831* (2013.01); *G01R 31/2822* (2013.01); *H01P 3/023* (2013.01)

(58) Field of Classification Search
CPC ... H03H 7/12; H03H 7/38; H03H 7/40; G01R 35/00; G01R 31/26; G01R 31/28; G01R 31/319; G01R 27/32
See application file for complete search history.

(56) References Cited

U.S. PATENT DOCUMENTS

| 5,910,754 | A | 6/1999 | Simpson | |
|---|---|---|---|---|
| 6,850,076 | B2 * | 2/2005 | Tsironis | G01R 27/32 324/637 |
| 8,933,707 | B1 * | 1/2015 | Tsironis | G01R 31/2831 324/637 |
| 9,257,963 | B1 * | 2/2016 | Tsironis | H01P 5/04 |
| 9,602,072 | B1 * | 3/2017 | Tsironis | H03H 7/40 |
| 2003/0132759 | A1 * | 7/2003 | Tsironis | G01R 1/06772 324/601 |

OTHER PUBLICATIONS

Load Pull [online], Wikipedia [retrieved on Nov. 18, 2016], Retrieved from Internet <URL:https://en.wikipedia.org/wiki/Load_pull>.
"V-band programmable tuner, model 7550", Product Note 5, Focus Microwaves Aug. 1993.
Standing wave ratio, VSWR [online], Wikipedia [retrieved Mar. 2, 2017], Retrieved from Internet <URL:http://en.wikipedia.org wiki/Standing _wave_ratio>.
High Resolution Tuners Eliminate Load Pull Performance Error, Application Note 15, Focus Microwaves, Jan. 1995.
(Continued)

*Primary Examiner* — Neel D Shah

(57) ABSTRACT

A waveguide low profile slide-screw impedance tuner for seamless on-wafer integration uses rotating metallic tuning probe. This ensures high resolution in the area where the probe penetration is maximum (high GAMMA), a smooth increase of depth (basic anti-electrical discharge—"Corona" form) and compensation for the negative phase trajectory at higher GAMMA, native to traditional vertically moving stub-probes in waveguide tuners. Also, using rotating disc-probes simplifies the tuner mechanics, eliminates the cumbersome precise vertical axis and gear and flattens the tuner profile for best direct connection with wafer-probes.

5 Claims, 15 Drawing Sheets

(56) References Cited

OTHER PUBLICATIONS

Waveguide Sizes [online], everything RF [retrieved on Jan. 30, 2019], Retrieved from Internet <URL:https://www.everythingrf.com/tech-resources/waveguides-sizes>.

U-Band Waveguide to 1 mm Connector Adapter, End Launch [online], Datasheet, Sage Millimeter Inc. [retrieved on Jan. 30, 2019] Retrieved from Internet <URL:https://www.sagemillimeter.com/content/datasheets/SWC-191M-E1.pdf>.

Network Analyzer Basics, Generalized Network Analyzer Block Diagram, pp. 33-41[online], Keysight Technologies [retrieved on Jan. 28, 2019], Retrieved from Internet <URL: https://www.keysight.com/upload/cmc_ upload/All/BTB_Network_2005-1.pdf>.

* cited by examiner

60GHz   75GHz   90GHz

60GHz   75GHz   90GHz

WAVEGUIDE SLIDE SCREW TUNER WITH ROTATING DISC PROBES

PRIORITY CLAIM

Not Applicable

CROSS-REFERENCE TO RELATED ARTICLES

1. Load Pull [online], Wikipedia [retrieved on Nov. 18, 2016], Retrieved from Internet <URL:https://en.wikipedia.org/wiki/Load_pull>.
2. "V-band programmable tuner, model 7550", Product Note 5, Focus Microwaves August 1993.
3. Standing wave ratio, VSWR [online], Wikipedia [retrieved Mar. 2, 2017], Retrieved from Internet <URL:http://en.wikipedia.org wiki/Standing_wave_ratio>.
4. "High Resolution Tuners Eliminate Load Pull Performance Error", Application Note 15, Focus Microwaves, January 1995.
5. Tsironis, C. U.S. Pat. No. 9,257,963, "Impedance tuners with rotating probes".
6. Simpson, G. et al. U.S. Pat. No. 5,910,754, "Reduced height waveguide tuner for impedance matching".
7. Waveguide Sizes [online], everything RF [retrieved on Jan. 30, 2019], Retrieved from Internet <URL:https://www.everythingrf.com/tech-resources/waveguides-sizes>.
8. U-Band and Waveguide to 1 mm Connector Adapter, End Launch [online], Datasheet, Sage Millimeter Inc. [retrieved on Jan. 30, 2019] Retrieved from Internet <URL: https://www.sagemillimeter.com/content/datasheets/SWC-191M-E1.pdf>.
9. Network Analyzer Basics, Generalized Network Analyzer Block Diagram, pages 33-41[online], Keysight Technologies [retrieved on Jan. 28, 2019], Retrieved from Internet <URL: https://www.keysight.com/upload/cmc_upload/All/BTB_Network_2005-1.pdf>.

BACKGROUND OF THE INVENTION

This invention relates to RF and millimeter-wave (26-110 GHz) load and source pull testing of medium and high-power transistors and amplifiers using remotely controlled electro-mechanical impedance tuners (see ref. 1). Modern design of high-power amplifiers and mixers, used in various communication systems, especially the upcoming 5G technology (~30 GHz base frequency), requires accurate knowledge of the active device's (millimeter-wave transistor's) characteristics. In such circuits, it is insufficient for the transistors, which operate in their highly non-linear regime, close to power saturation, to be described using non-linear numeric models only.

A popular method for testing and characterizing such millimeter-wave components (transistors) in the non-linear region of operation is "load pull" and "source pull". Load/source pull is a measurement technique employing impedance tuners (see ref. 2) and other test equipment (FIG. 1). The tuners (2), (4) are used in order to manipulate the impedance conditions under which the Device Under Test (3) (DUT, or transistor) is tested, see ref. 1. The test equipment includes at least a signal source (1) which injects power into the DUT (3) and a signal detector (power meter, spectrum analyzer, etc.) measuring the resulting output power (5), DC bias supply networks equipment and, possibly, a spectrum analyzer. Equipment and tuners are controlled by a computer (6) using digital cables (7, 8, 9). This document refers to "impedance tuners", in order to make a clear distinction to "tuned receivers (radios)", popularly called elsewhere also "tuners" because of the included tuning circuits.

Waveguide impedance tuners (see ref. 2) comprise, in general, a solid housing (20) a waveguide transmission line (203) having an input or test (25) and an output or idle (26) port, both ports being equipped with waveguide flanges, and a conductive adjustable tuning stub (tuning probe). The probe has a conductive section (23) and a dielectric portion that acts as a handle (204) and is mounted in a mobile carriage (28) and its penetration (29) into the slot (22) of the waveguide (203) is controlled by a precise vertical axis (21); the dielectric handle (204) prevents energy leakage through the slot (22) and creation of disturbing higher propagation modes and loss of energy. The probe is also moved (24) along the axis of the waveguide, using an ACME rod (27) or other mechanism by the stepper motor (201); the probe (23) creates a variable reactance inside the waveguide, seen at the test port (25), allowing thus the synthesis of various impedances (or reflection factors) covering parts or the totality of the Smith chart (the normalized reflection factor area). The relation between reflection factor and impedance is given by GAMMA=(Z−Zo)/(Z+Zo) or VSWR=(1+|GAMMA|)/(1−|GAMMA|), see ref. 3, where Z is the complex impedance Z=R+jX and Zo is the wave impedance of the waveguide which varies, depending on the mode of propagation, within a factor 2 of the free space impedance of 377 Ohms (see ref. 2).

Up to now such conductive or metallic probes (slugs) have been made in form of small cylindrical or rectangular conductive stubs (33), see ref. 6, attached to dielectric handles (35). In FIG. 4 the probe (42) creates a variable capacitance increasing as it is inserted (34) towards the bottom of the waveguide (32, 41) using a vertical axis (31) and motor (30). The phase is controlled when the probe (42) is moved horizontally (40) along the waveguide (41). The disadvantage of this technique is the requirement of high precision, straightness and resolution vertical probe movement mechanisms (31), which cause the tuner to have a relatively high profile; the high profile (VA in FIG. 14) is incompatible with many on-wafer integrations (area (88) in FIG. 8). Especially the required straightness (avoidance of wobbling) of the vertical screw of the axis, requires sophisticated and cumbersome guidance control (see FIG. 14).

SUMMARY OF THE INVENTION

This invention describes RF, preferably millimeter-wave ("mm-wave") frequency, computer controlled electro-mechanical impedance tuners and a low loss mounting method in a wafer test setup. The low-profile tuner uses rotating partly metallic or metallized (conductive) disc-formed probes, instead of the stub-formed cylindrical or rectangular conductive probes, used hitherto in such devices (item 30 in FIG. 11 of ref. 6 and column 4, line 61) and, because of the low profile, is efficiently integrated in wafer test setups.

BRIEF DESCRIPTION OF THE SEVERAL VIEWS OF THE DRAWINGS

The invention and its mode of operation will be more clearly understood from the following detailed description when read with the appended drawings in which:

FIG. 7A depicts full insertion and maximum reflection; FIG. 7B depicts intermediate state and medium reflection; FIG. 7C depicts minimum penetration and reflection; FIG. 7D depicts oval probe inserted intermediary.

FIG. 10A depicts maximum VSWR; FIG. 10B depicts VSWR control through rotation angle Φ; for definition of Φ see FIG. 7B.

DETAILED DESCRIPTION OF THE INVENTION

Figure 5:
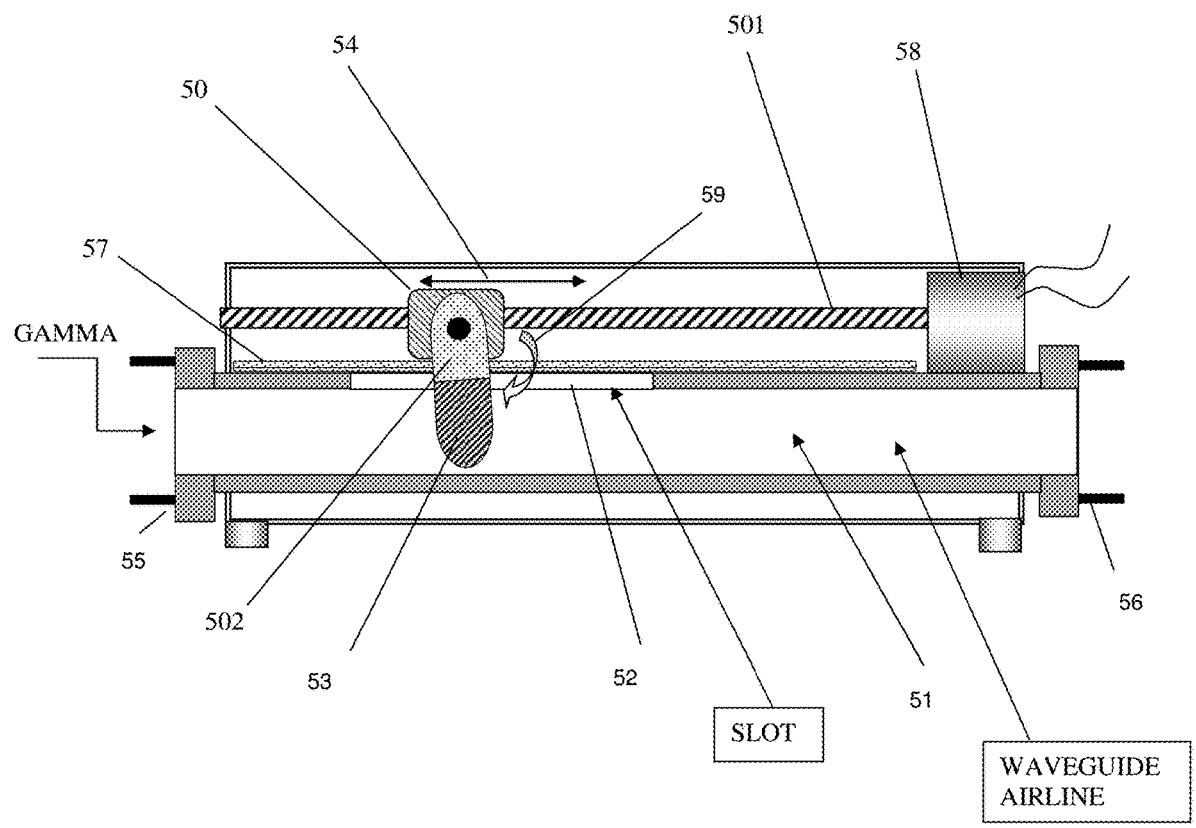
FIG. 5 depicts the operation of the partly conductive disc probe inside the waveguide slot.

The waveguide tuner comprises a slotted section of rectangular waveguide with an input (55) (test) and an output (56) (idle) port; the slot is cut only into one large wall of the waveguide and centered along the input-output axis (FIG. 11) and the elliptical disc-probe is attached to the axis of a remotely controlled stepper motor (50), (60), which rotates it; the probe is thus insertable into- and out- of the slot. The penetration of the disc inside the cavity of the waveguide controls the amount of signal power reflected and thus the reflection factor GAMMA. The preferred embodiment is shown in front view in FIG. 5 and in cross section in FIG. 6. In FIG. 5 the partly conductive elliptic disc probe having a conductive bottom section (53) and a dielectric support section (502) is attached to the axis of a small stepper motor (50) and rotates in- and out- (59) of the slot (52) which has been cut into the top wall of the waveguide (51). The waveguide has an input (test) port (55) and an output (idle) port (56). When used as an input tuner the test port is the output port (56). Input and output refer to the signal flow. Depending on the size of the waveguide the stepper motor (50), (60) is attached to the threaded block (61) (not visible in FIG. 5) directly or through a bracket; the bracket is controlled by an ACME rod (501) which is controlled by a second stepper motor (58) and moves the assembly motor (50), (60) plus block (61) horizontally (54) on the rail (57), (62) along the waveguide slot (52). Whereas the rotation (59) controls the amplitude of the reflection factor GAMMA the horizontal movement (54) controls the phase of GAMMA.

Figure 6:
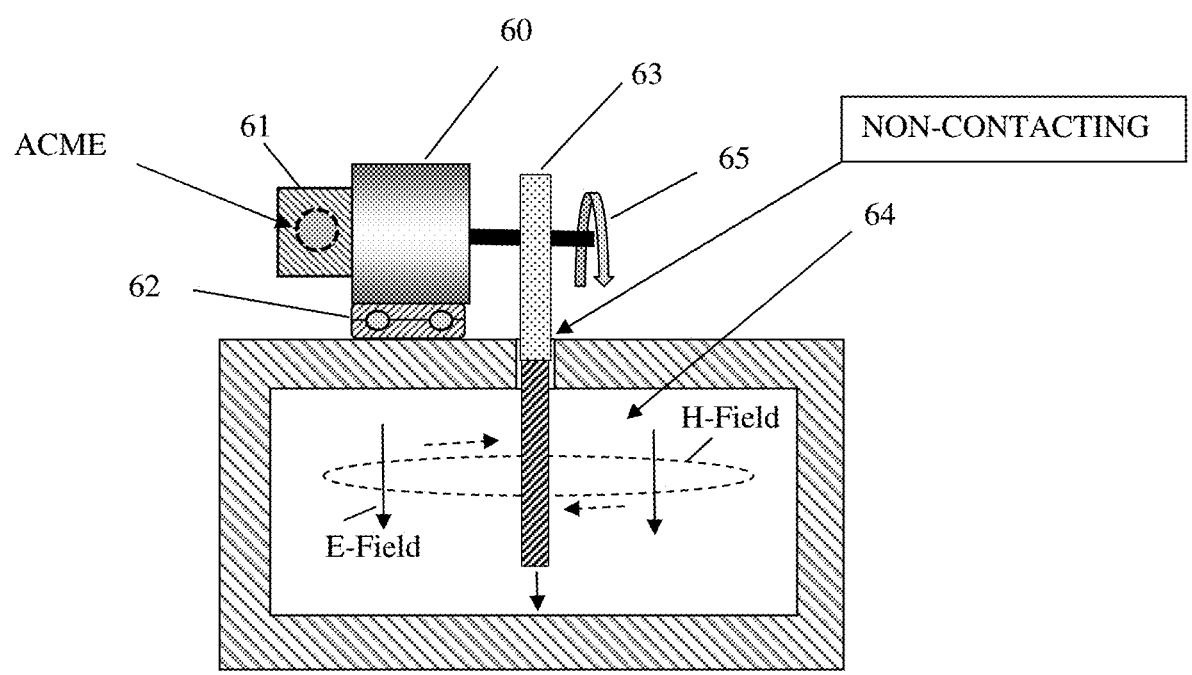
FIG. 6 depicts the cross section of the operation of the partly conductive disc probe inside the waveguide slot.
Figure 15:
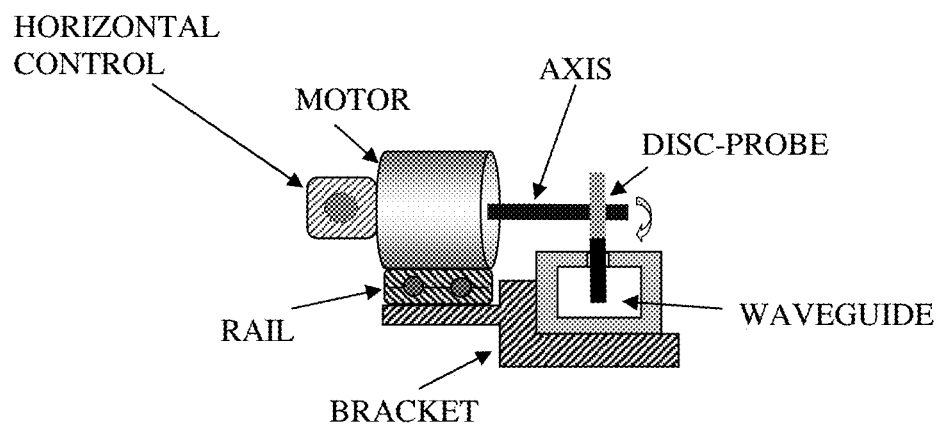
FIG. 15 depicts representative cross section of tuner using small size waveguide and sideward mounted probe control assembly.

The cross section of the tuner waveguide is shown in FIG. 6. The partly conductive disc probe (63) is attached perpendicularly to the axis of the motor (60) and is rotated (65) into the waveguide (64) in a non-contacting relation, creating a capacitive electric field disturbance causing the controlled reflection. The motor (60) is attached to the anchor (61) and rolls on a slider rail (62) along the waveguide, pulled horizontally by the ACME rod (501) which is controlled by motor (58). Depending on the size of the waveguide, relative to the motor (60) the rail (62) can be mounted "on" the waveguide itself or on the side using a bracket and support mechanism (see FIG. 15). In all cases the disc-probe control including the rail, the bracket and the motor are equivalent to the prior art horizontally movable carriages (28) and are defined herein as such.

Figure 7A:
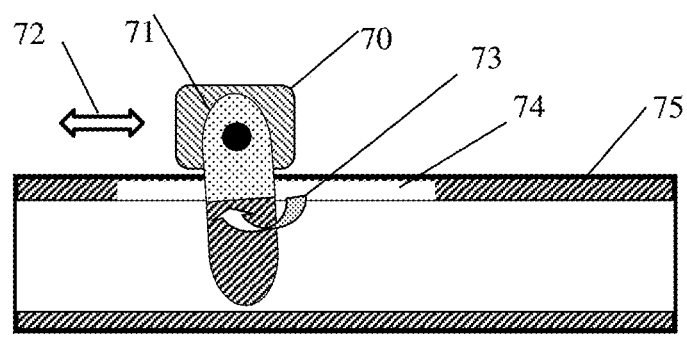
FIGS. 7A through 7D depict the various settings of the rotating disc probe.
Figure 7B:
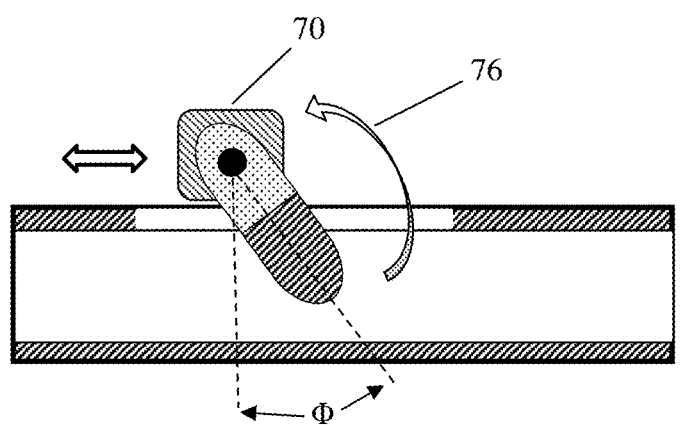
Figure 7C:
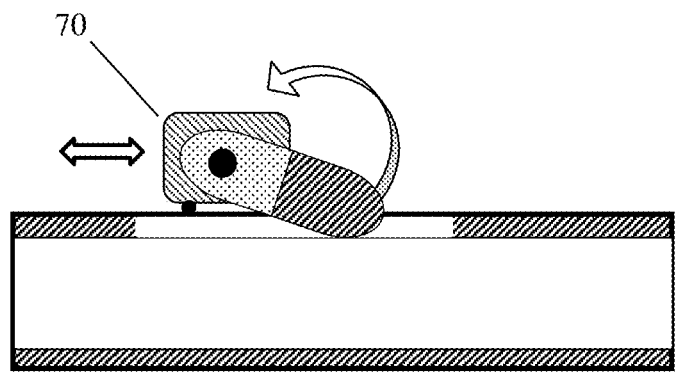
Figure 7D:
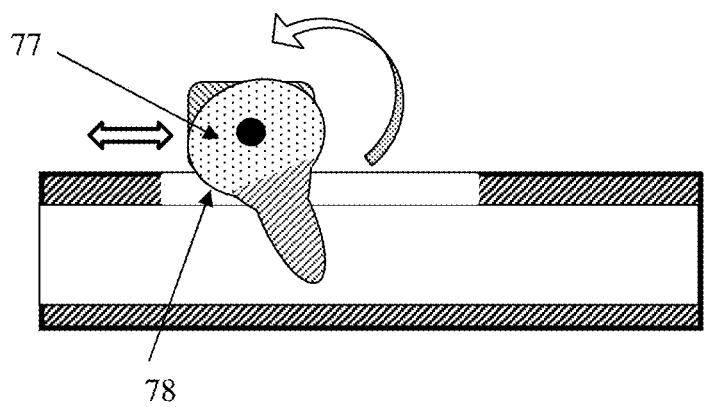

The various states of the contactless partly conductive probe penetration are shown in FIG. 7A to 7D, depicting various possible states of the disc-probe. FIG. 7A depicts maximum penetration and reflection. The probe is only partly conductive, having a dielectric handle and a conductive insertable body, because, similarly to stub probes, the existence of conductive substance traversing the slot, allows energy leakage into the environment by generating spurious radiating electro-magnetic modes, which alter the basic TE10 propagation behavior of the waveguide, alter negatively the response of the tuner and drain energy. The conductive portion of the elliptic probe (73), having an overall approximate ratio of small to large diameter of 1:3, or less, approaches, when inserted into the slot (74) to a maximum depth, the bottom of the waveguide (75). The probe is attached to the axis (71) of the motor (70) and rotates with it. The whole assembly is then moved horizontally (72) and controls the phase of the reflection factor. FIG. 7B shows an intermediate state whereby the rotation (76) angle Φ is approximately 40° (compare also FIG. 10B). Finally, FIG. 7C depicts the state whereby the probe is rotated out of the slot, in which case the reflection factor GAMMA is equal to the residual reflection factor of the slotted waveguide. There is a compromise between residual reflection factor and thickness of the disc probe. A rule of thumb says that the slot shall not exceed ⅓ of the inner waveguide width. For low frequencies waveguides this is easy to maintain. But for waveguides in frequencies above 100 GHz (WR6 waveguide covers 110-170 GHz and has a width of 1.65 mm, in which case the slot, and disc-probe thickness, shall not exceed 0.5 mm), see ref. 7.

Figure 1:
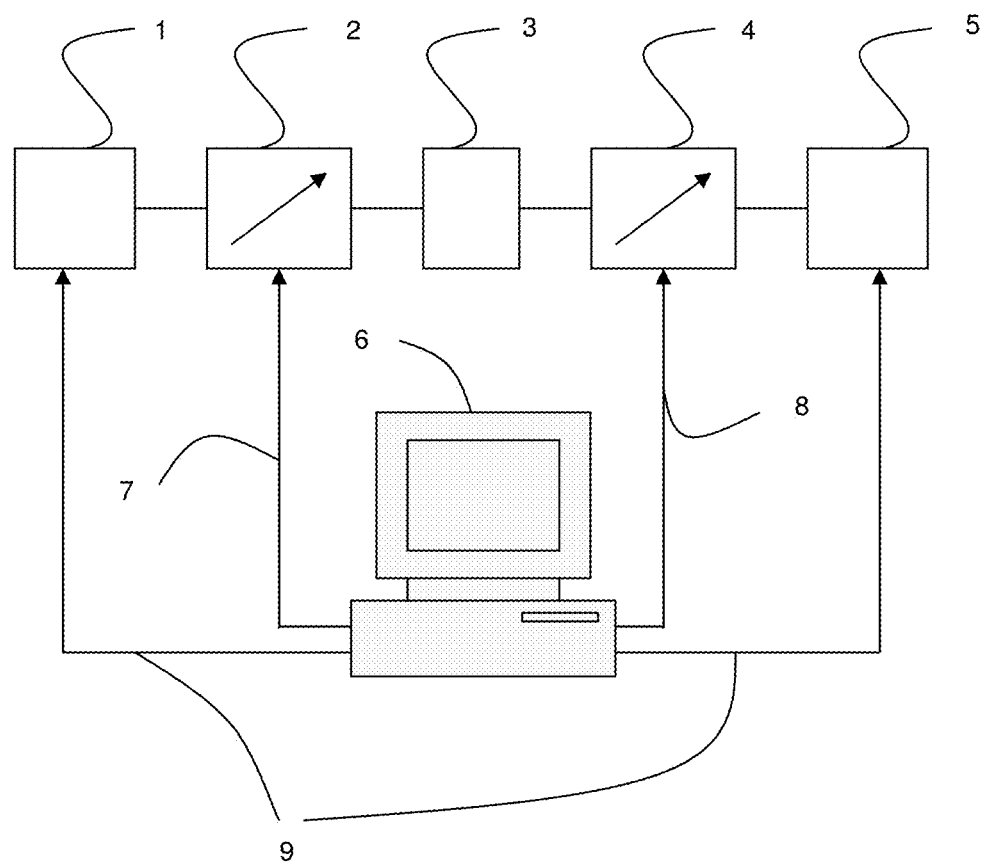
FIG. 1 depicts prior art, a typical automated transistor load pull test system.
Figure 2:
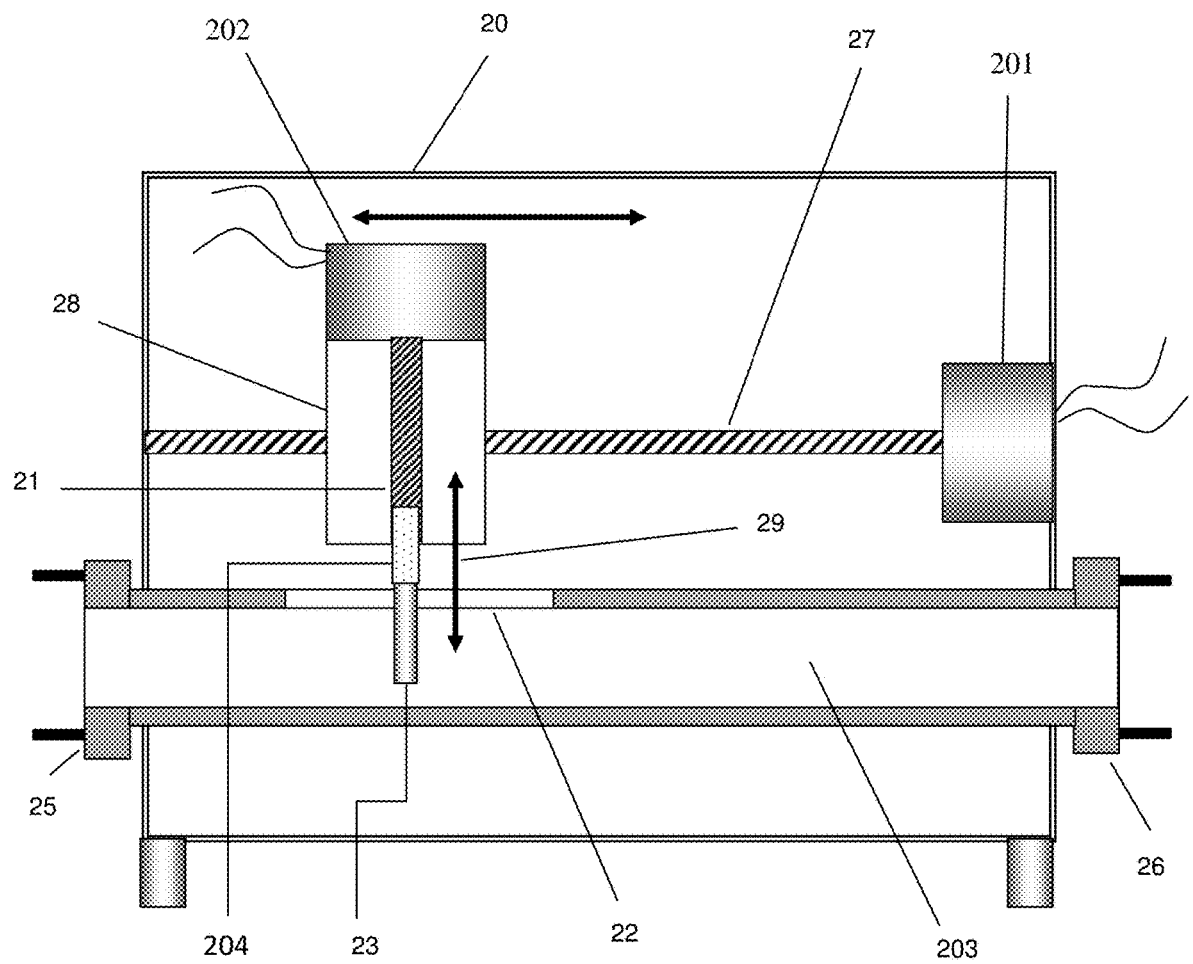
FIG. 2 depicts prior art, a front view of an automated slide screw waveguide impedance tuner using a single vertical axis and capacitive iris probe.
Figure 3:
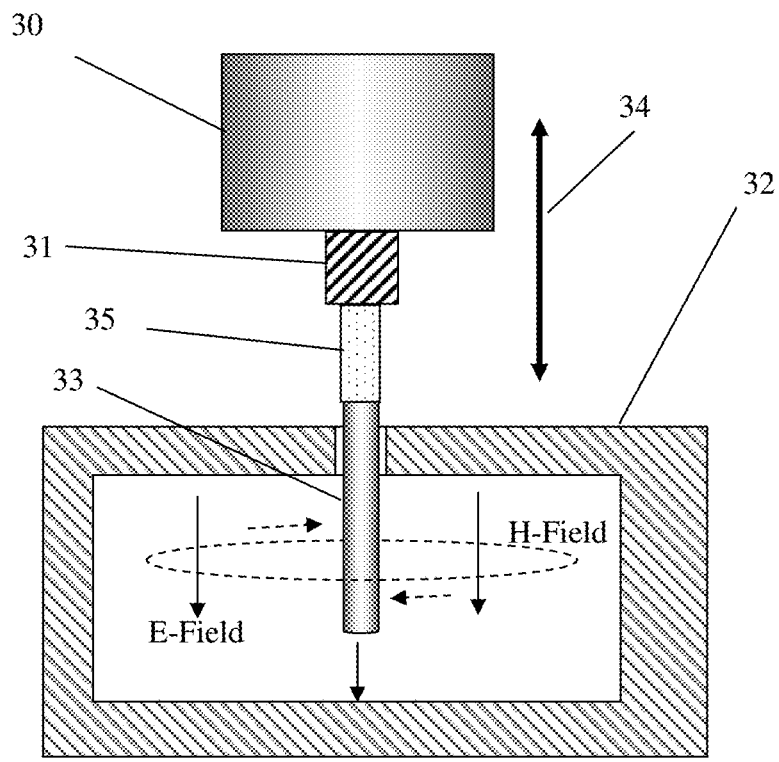
FIG. 3 depicts prior art, cross section of capacitive iris probe inside a slotted waveguide transmission line.
Figure 4:
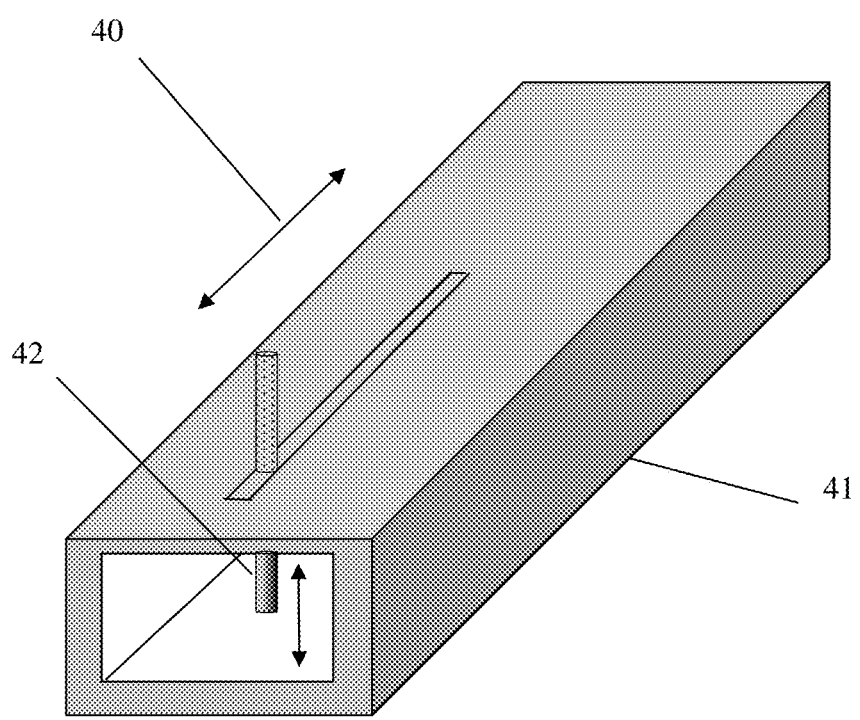
FIG. 4 depicts prior art, a perspective view of the movement of a stub probe in the waveguide slot.
Figure 8:
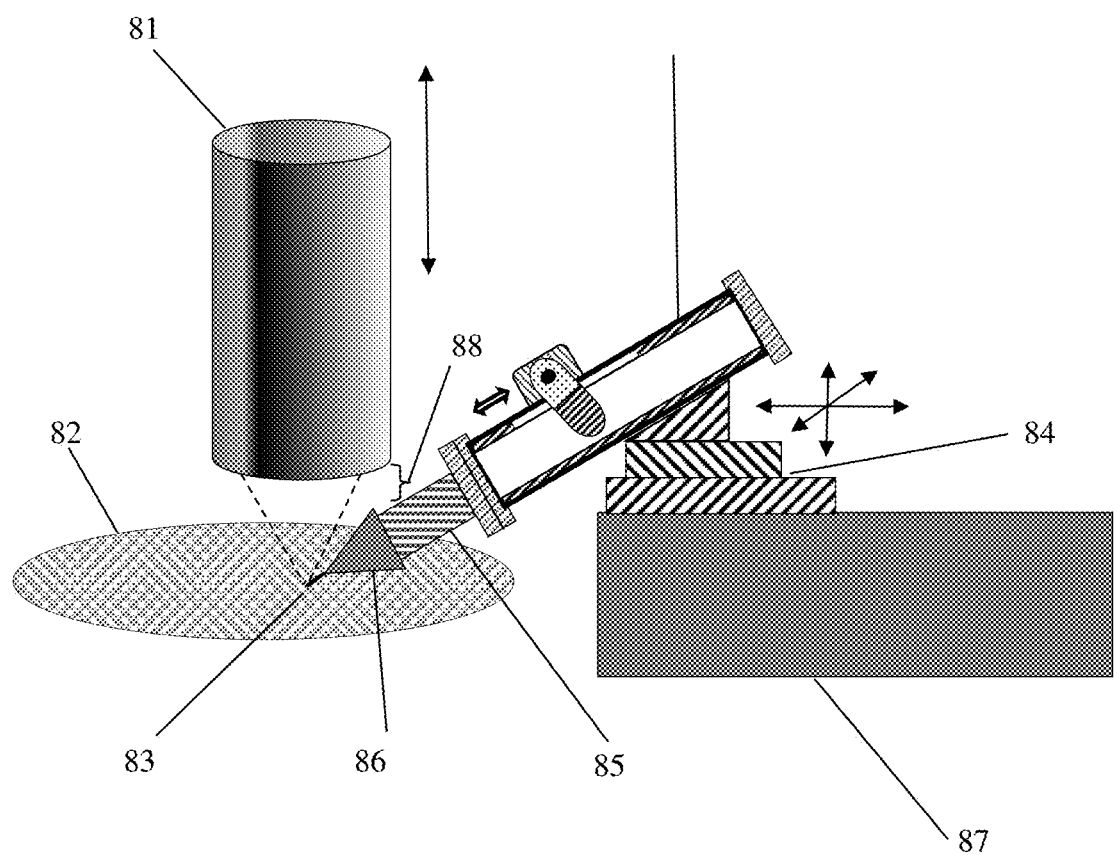
FIG. 8 depicts on wafer load pull setup using tuner with disc-probe and wafer probe with straight probe-to-waveguide adapter.
Figure 11:
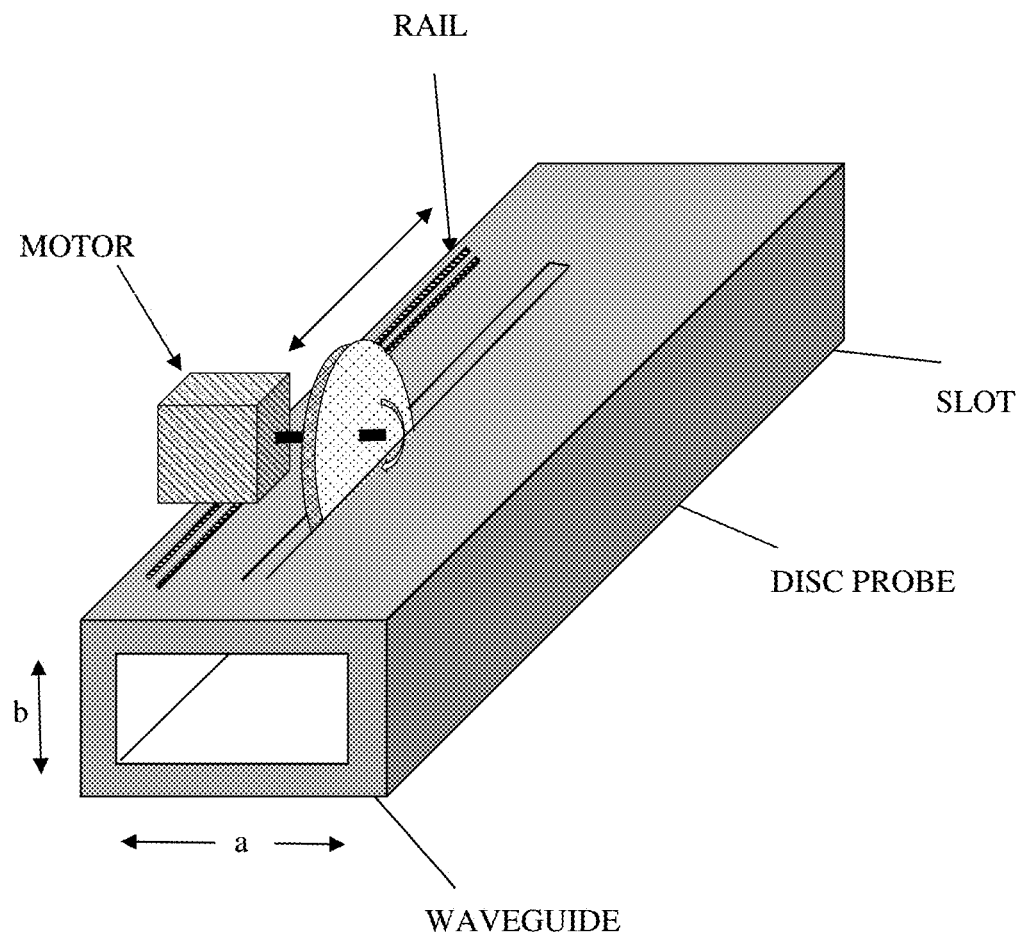
FIG. 11 depicts perspective view of waveguide section with elliptic partly conductive disc-probe and control.
Figure 14:
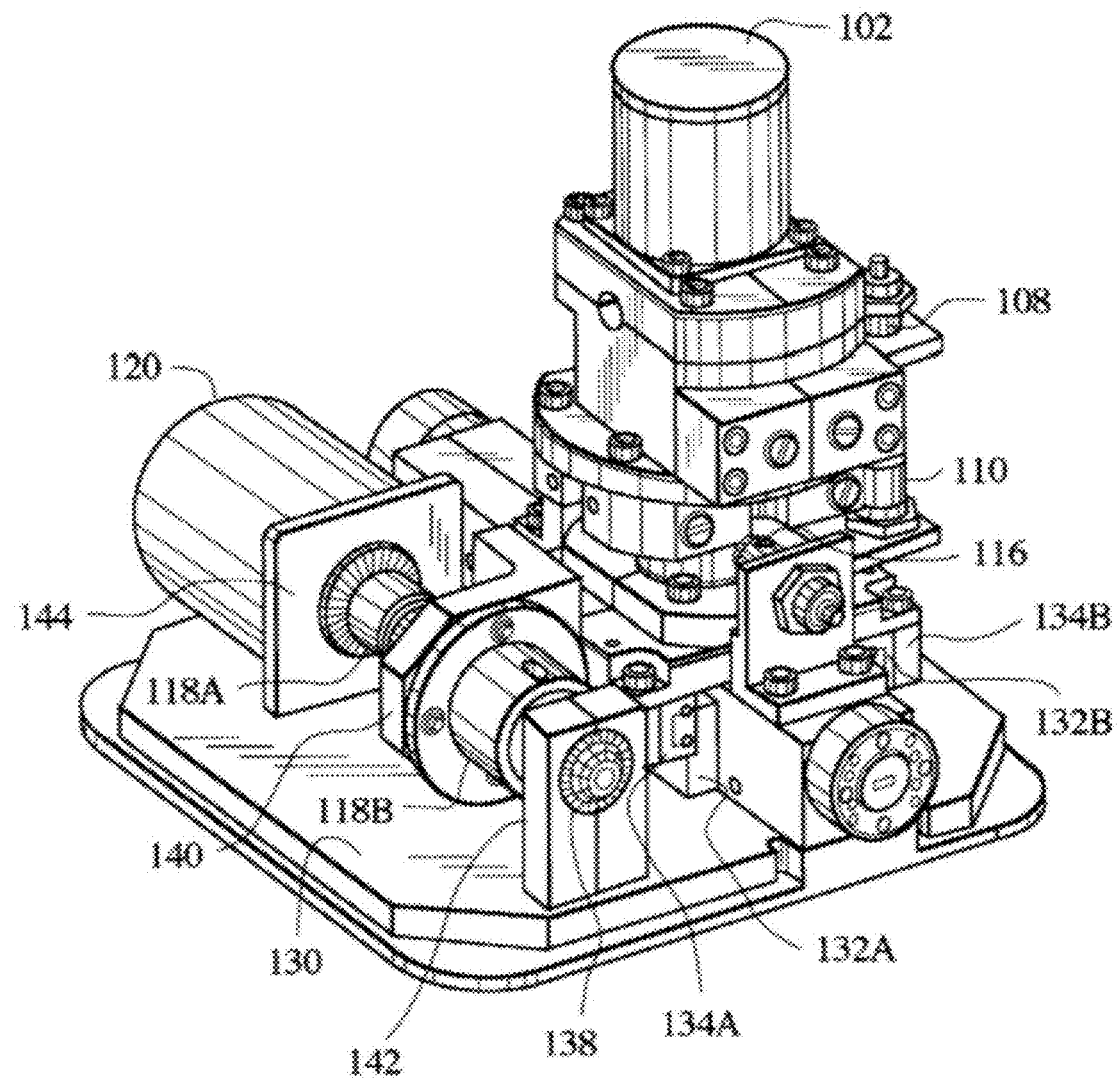
FIG. 14 depicts prior art: Waveguide tuner horizontal and vertical probe control (see FIG. 10 in ref. 6).

A perspective view of the active tuner section is shown in FIG. 11. The length of the slot is as required to move the extracted disc-probe (FIG. 7C) one half of a wavelength (λ/2) along the waveguide. The slot in this case is slightly longer than in the case of a stub probe (FIG. 4) since, in the stub case, the slot shall only be λ/2 plus the diameter of the stub, whereas in the disc-probe case, it shall be λ/2 plus "b", wherein "b" is the internal height of the waveguide (see FIG. 11). This is the compromise required to allow for the simplification of the amplitude control mechanism from a vertical axis (21) control mechanism (items (21) plus (202)) in FIG. 2 and (VA=102 . . . 132B) in FIG. 14, to a low-profile control (50) in FIG. 5 and (61) in FIG. 6. The low-profile amplitude control is the key benefit, in addition to the higher robustness of the disc-probe compared with the stub probe, allowing avoidance of the insertion loss (FIG. 12) and the seamless integration of the tuner on wafer shown in FIGS. 8 and 9.

Figure 12:
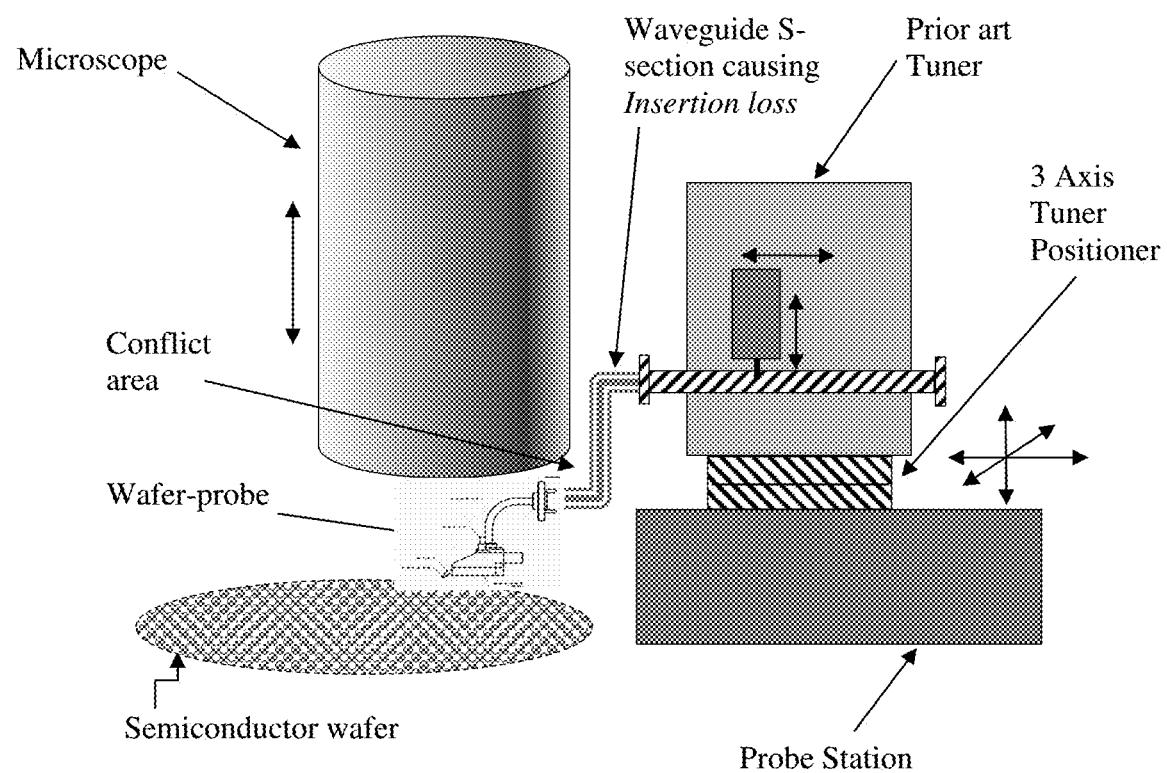
FIG. 12 depicts prior art: Method of tuner mounting for on-wafer testing using long S-bend section. Small lettering around the imported image of the wafer-probe is to be ignored.
Figure 13:
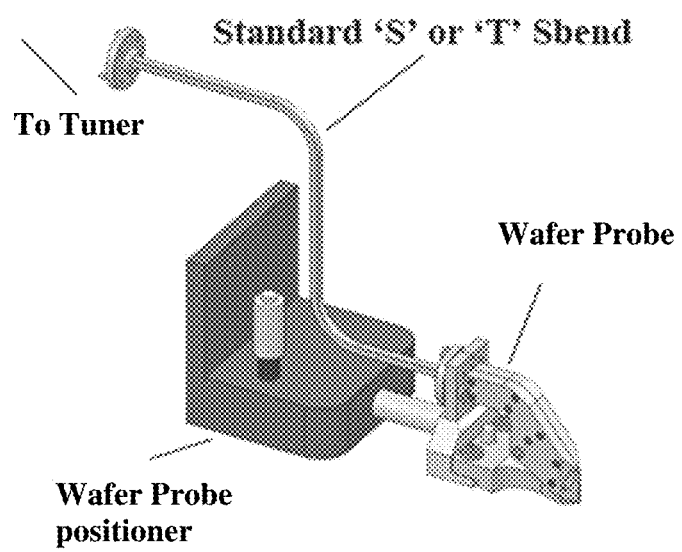
FIG. 13 depicts prior art: commercially available waveguide S-bend for millimeter-wave wafer probes controlled by probe (not tuner) RF positioner.

A test setup allowing testing naked (i.e. not sectioned, separated, mounted in test fixtures and wire-bonded) semiconductor chips on wafer is called a wafer-test-setup. A load/source pull setup allowing the same is called a wafer load pull test setup. Prior art on-wafer integrations use extended waveguide sections to match the tuner to the wafer-probe (FIG. 12). Such an extended waveguide S-bend adapter structure is shown in FIG. 13. This adapter not only introduces |GAMMA|-reducing insertion loss, but also creates limitations and possible "conflict" in microscope movement (FIG. 12). Instead, the configuration laid-out in FIG. 8 avoids such mechanical conflict (88). The probe (86) is attached to the tuner (80) directly using a short straight wafer-probe to waveguide adapter (85) and reaching the probe tip (83) under minimum loss conditions (see ref. 8). The microscope (81) is freely adjustable to focus on any spot on the wafer (82). The tuner (80) is mounted on the 3-axis tuner positioner (84), inclined under the appropriate angle matching the angle of the wafer-probe adapter; the 3-axis positioner itself is mounted on the probe station table (87). The output tuner is inserted between the output wafer probe and the signal detector, which is typically a power meter, a spectrum analyzer, the test port of a VNA or a combination thereof.

Figure 9:
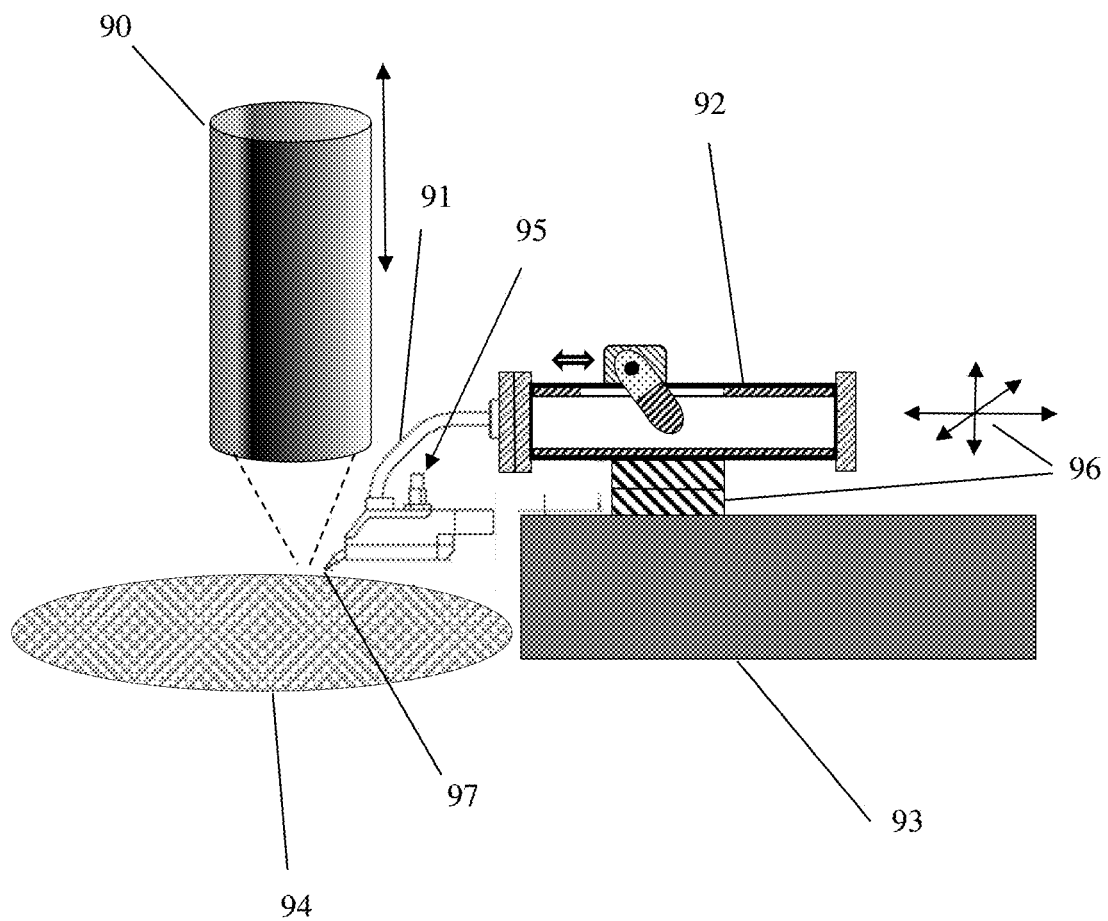
FIG. 9 depicts on wafer load pull setup using tuner with disc-probe and wafer probe with waveguide bend and bias network.

If a straight wafer-probe and waveguide adapter (85), see ref. 8, system is not available, then the embodiment of FIG. 9 is necessary, using readily available waveguide wafer probes equipped with a 90° waveguide bend (91), which, allow avoiding conflict with the microscope (90) and, additionally, provide for DC biasing (95) at the DUT-probe tip (97) which connects with the DUT on the semiconductor wafer (94). The low-profile tuner (92) of FIG. 5 can be mounted flat on the positioner (96), which is anchored on the station table (93). This solution at least eliminates the lossy S-bend interface section (FIGS. 12 and 13).

The test setup embodiment, disclosed here as a load pull assembly only, can obviously, be expanded to a load and source pull configuration, in which case a second tuner is inserted between the signal source and the input wafer probe, mounted and controlled similarly to the output tuner. The adoption of inclined or flat mounting of the tuner and the use of straight or bend-equipped wafer-probes (see FIGS. 8 and 9) is a technicality dictated by the size and configuration of the wafer-probe station and the microscope.

Figure 10A:
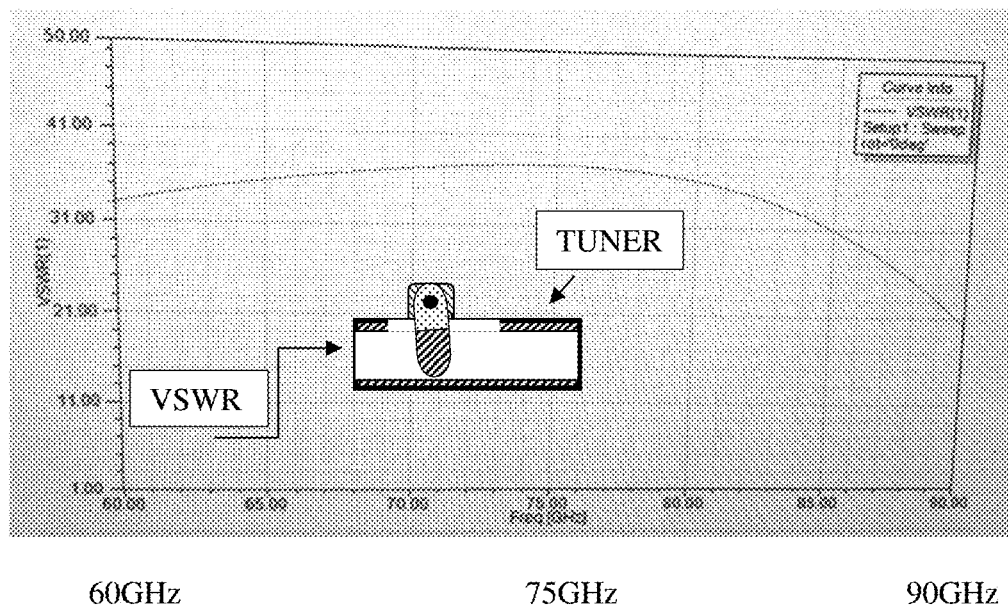
FIG. 10A through 10B depict reflection (VSWR) of E-band tuner using elliptic disc-probe in 60-90 GHz range (WR 12)
Figure 10B:
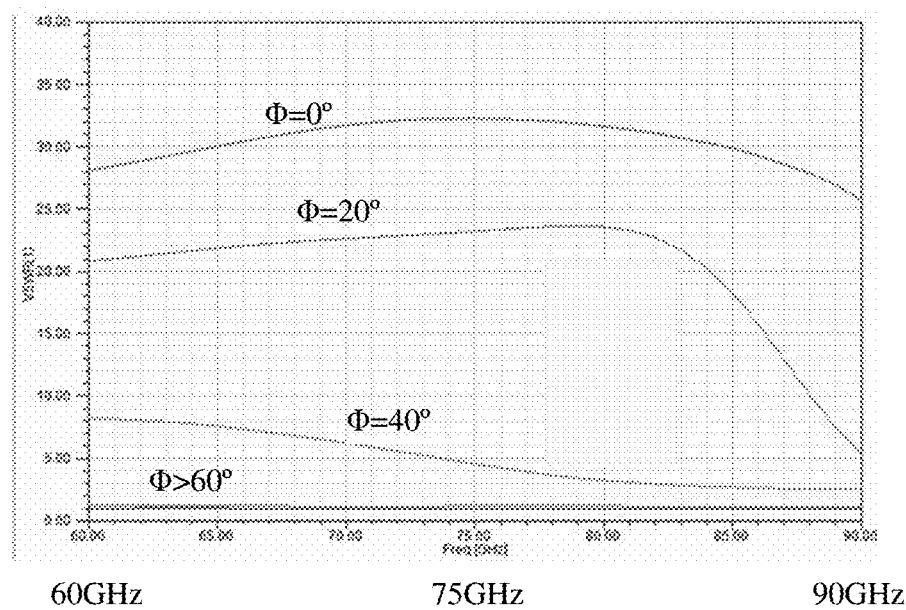

The capacity of the rotating elliptic disc-probe to generate controlled reflection factor GAMMA over the entire waveguide band, up to a maximum equivalent to prior art stub probes is shown in FIGS. 10A and 10B. As an example, the frequency range 60-90 GHz is shown (band E) using waveguide type WR-12 with large dimension a=0.162" (4.11 mm), b=0.061" (1.55 mm), see FIG. 11. FIG. 11 shows the actual embodiment of the core section of the waveguide tuner with rotating non-contacting disc-probe. The stepper motor slides on the rail, which runs exactly parallel to the slot and controls, via its axis, the penetration of the disc-probe into the slot. The |GAMMA| control mechanism is strongly simplified compared with the prior art vertical mechanism (items (102) to (132B) in FIG. 10 of ref. 6) depicted also here as FIG. 14.

The rotation of the bottom point of the disc-probe as it approaches the bottom of the waveguide causes the tip of the disc to travel horizontally. The disc-probe does not approach the bottom at one point (FIG. 7A to 7D); the increase of the capacitance, as the probe approaches the bottom creates a negative phase turn of GAMMA on the Smith chart; this horizontal shift of the closest point, when viewed from the test port of the tuner (from the left side in FIG. 7) will create a compensation of the natural positive phase rotation which will also improve the interpolation accuracy of the algorithms used to calculate GAMMA between calibrated points, see ref. 5. Other advantages of the disc-probe are as in ref. 5 column 3, lines 55ff.

The same effect of the elliptic probe can be reached if the disc-probe has an oval shape; electro-magnetic calculations show that the larger the immersed bottom of the probe, the higher the capacitive field disturbance which causes a drop-off in reflection above a certain frequency (see FIG. 10B); therefore a good compromise is an oval form (77), (see FIG. 7D) in which case the wide top allows (i) solid mounting on the motor (70) axis and (ii) guidance of the disc body inside the slot (78) and the narrow bottom, inserted into the slot (74), (iii) avoiding excessive capacitive load. By rotating the probe we can reach various levels of penetration and control of the reflection factor. There are several forms that allow this to happen; we only disclose here the two embodiments of elliptic disc and oval disc to show the globally valid concept, on which the invention relies.

The tuner is calibrated before it can be used in load or source pull operations. The calibration process uses a pre-calibrated vector network analyzer (VNA, see ref. 9) of which the test ports are connected to the tuner ports using high quality mm-wave cables or waveguides; the stepper motors (50) and (58) are directed by a computer, via electronic interface, to rotate the disc probe into the slot of the waveguide in order to control the amplitude of GAMMA, and along the waveguide to control the phase of GAMMA, while reading the four scattering parameters (S-parameters) from the VNA using digital cables and standard communication protocol. The S-parameters of the tuner two-port are measured at typically 10 to 20 angles $\Phi.j$ ($0 \leq j \leq 10$) or ($0 \leq j \leq 20$) of the disc-probe, corresponding from minimum to maximum |GAMMA|, and horizontal positions Xi between a starting (zero) position Xi=0 (which is typically closest to the test port) and Xi=$\lambda/2$ (one half of a wavelength at the selected frequency) and saved in a calibration file in the form Sij(Xi,$\Phi$,j); this procedure is repeated for each frequency of interest and the data are saved in one or more calibration files for later use.

Obvious alternative embodiments concerning the exact form of the rotating disc-probes in a waveguide slide screw tuner structure are possible but shall not impede on to the basic idea and the broad validity of the present invention.

What I claim as my invention is:

1. A waveguide slide screw impedance tuner comprising: an input and an output port, and at least one straight waveguide airline section between the ports, slotted into a large wall along the input-output axis, and a disc-shaped, tuning probe comprising a conductive part and a non-conductive part, of which at least a conductive portion is insertable, in a non-contacting relationship, into the waveguide slot, and a disc probe control assembly, moving parallel to the slot of the waveguide, airline, wherein the disc probe control assembly includes a first remotely controlled stepper motor which controls the disc probe, and gear, and wherein the disc-probe is carried by the control assembly and rotates parallel to the waveguide slot around an axis which is perpendicular to the disc probes surface and to the waveguide slot.

2. The slide screw waveguide impedance tuner of claim 1, wherein the slot is centered on the large waveguide wall.

3. The slide screw waveguide impedance tuner of claim 1, wherein
- the first stepper motor controls an angle of rotation of the disc-probe, and
- a second, remotely controlled, stepper motor controls a position of the probe control assembly along the waveguide using an ACME rod.

4. The waveguide slide screw impedance tuner as in claim 1, wherein the disc-probe is elliptical.

5. The waveguide slide screw impedance tuner as in claim 1, wherein the disc-probe is oval.

* * * * *